United States Patent
Washburn et al.

(10) Patent No.: US 7,312,637 B2
(45) Date of Patent: Dec. 25, 2007

(54) ENHANCED TIMING MARGIN MEMORY INTERFACE

(75) Inventors: Robert D. Washburn, Malibu, CA (US); Robert F. McClanahan, Valencia, CA (US)

(73) Assignee: Thunder Creative Technologies, Inc., Malibu, CA (US)

( * ) Notice: Subject to any disclaimer, the term of this patent is extended or adjusted under 35 U.S.C. 154(b) by 105 days.

(21) Appl. No.: 11/206,638

(22) Filed: Aug. 17, 2005

(65) Prior Publication Data

US 2006/0044894 A1    Mar. 2, 2006

Related U.S. Application Data

(60) Provisional application No. 60/605,458, filed on Aug. 17, 2004.

(51) Int. Cl.
*H03K 19/0175*    (2006.01)

(52) U.S. Cl. .................. 326/82; 326/104; 327/170
(58) Field of Classification Search .............. 326/82, 326/83, 89, 31, 104; 327/111, 112
See application file for complete search history.

(56) References Cited

U.S. PATENT DOCUMENTS 6,717,479 B2 *    4/2004    Suda ........................... 331/57
7,119,549 B2 *    10/2006    Lee et al. ................... 324/601

* cited by examiner

*Primary Examiner*—Daniel Chang
(74) *Attorney, Agent, or Firm*—J. D. Harriman, II; DLA Piper US LLP

(57) ABSTRACT

The present invention is an electronic circuit that significantly enhances timing margin in high-speed, digital memory modules. The circuit is implemented is applicable to all switching waveforms on both control and data signal lines that drive the memory bus. Implementation of the present invention also provides a significant reduction in power dissipation compared to memory modules of comparable size and speed utilizing the present art.

23 Claims, 2 Drawing Sheets

ENHANCED TIMING MARGIN MEMORY INTERFACE

CROSS-REFERENCE TO RELATED APPLICATION

The present application claims the benefit of priority from pending U.S. Provisional Patent Application No. 60/602,548, entitled "Enhancing Timing Margin Memory Interface", filed on Aug. 17, 2004, which is herein incorporated by reference in its entirety.

BACKGROUND OF THE INVENTION

1. Field of the Invention

The present invention relates to the field of digital memory modules and more specifically it relates to means for transmitting data and control signals onto individual lines in the memory interface buss.

2. Background Art

Digital memory modules such as used in computers, printers, and telecommunications equipment are clocked devices that must communicate data, control, and status signals onto a memory buss. The signals are digital signals that are typically switched synchronously with the memory clock. Following a clocked transition, signals require a period of time to stabilize and allow switching transients to die off before their signal state can be considered "valid". The time difference between the time of signal stabilization and the start of the subsequent clocked transitioning minus the time required by the system to receive the valid information comprises the timing margin of the memory.

Historically, timing margin (as well as power consumption) has not represented a major problem with memory modules. When more than one signal was to be coupled onto a single line in the memory buss, memory buss driver outputs were connected together as the simplest and lowest cost method for driving the memory buss, because timing margin was not a concern. An example prior art configuration is illustrated in FIG. 1. Signals A and B are coupled to node 100 through buffers U100 and U101 respectively. The output of node 100 is strobed for A or B as desired.

With the increasing need for higher speed memory, timing margin can no longer be ignored. The combined transition and stabilization time now represents a significant portion of, if not the entire, clock period. Since transition times and time delays are subject to manufacturing variability, timing margin has become both small and widely variable. This makes for low yield production and very costly memory modules.

In addition to the timing margin problem, the trend has been toward larger and larger capacity memory modules. The transition period with associated high current draw has resulted in a major power consumption/distribution problem for state of the art memory modules. One of the major sources for high power consumption is the use of simple wired-OR connections of multiple line driver outputs driving the memory buss. During transitions, both upper and lower type switching devices within the line drivers attached to an individual line in the buss can be "on" or partially "on". This results in high transient current flow and resulting high power dissipation. At high memory clock rates, this represents a high "duty cycle" that will only become worse with increasing memory clock rates in the future. For large memory modules, there are such a large number of the transitions occurring at a typical clocked transition that the total power consumption is large and difficult to deal with given conventional memory module to motherboard interfacing.

As a result, it would be extremely desirable to have digital memory to memory buss interface circuitry that would provide adequate timing margin for memory modules at higher clock frequencies while reducing the total power consumption associated with the present buss interface.

SUMMARY OF THE INVENTION

The present invention is an active, electronic circuit that is used within a digital memory circuit and comprises a number of features. One feature is the use of a single line driver per memory bus line instead of the wired-OR line drivers used in the present art. Another feature is the use of one or more logic gates to perform signal combining or signal selection functions and thereby avoid the need for the multiple, wired-OR line drivers used in the present art. Another feature comprises the use of timing margin enhancement circuits that independently adjust the rise and fall time of the digital signal transitions for each signal that would be applied to and drive the memory bus line through its separate line driver in the present art. The timing margin enhancement circuits are applied to both memory data and control/status signals.

In one or more embodiments, the present invention includes an OR gate for signal selection. In one or more embodiments, the timing margin enhancement circuits are implemented using multiple transistors in a totem-pole configuration. In one or more embodiments, the timing margin enhancement circuits are implemented using single transistors. In one or more embodiments, the timing margin enhancement circuits are implemented using Field Effect Transistors (FETs). In one or more embodiments, the timing margin enhancement circuits are implemented using bipolar transistors.

DETAILED DESCRIPTION OF THE INVENTION

The present invention is directed to circuitry for use in a memory module. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention. Except as noted herein, common components and connections, identified by common reference designators function in like manner in each circuit.

Figure 1:
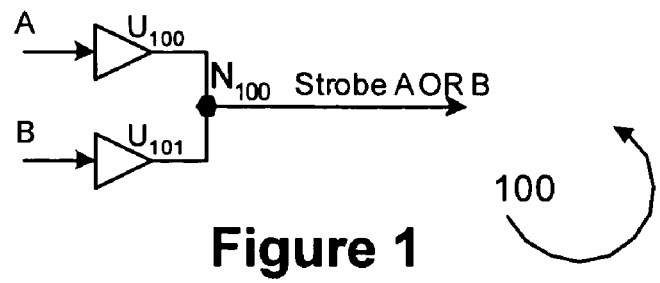
FIG. 1 is a circuit diagram illustrating wired-OR line driver output interconnection typically used to drive memory data and control bus lines on digital memory modules.
Figure 2:
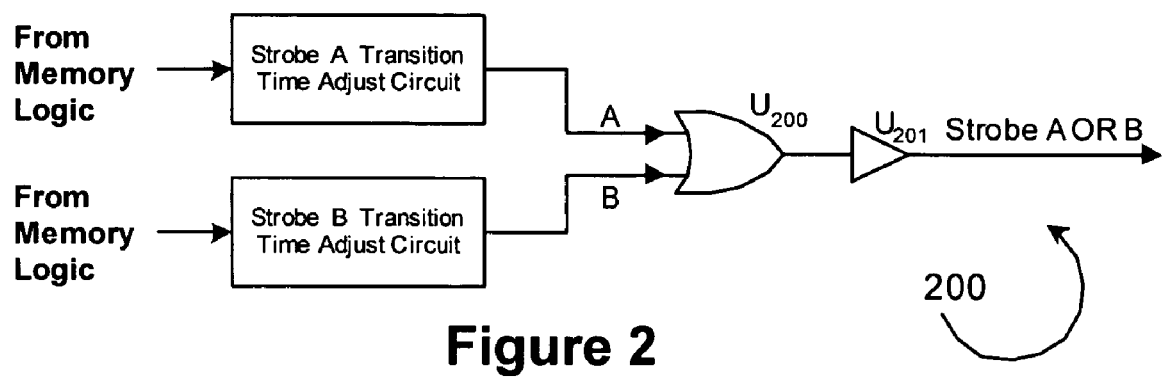
FIG. 2 is a block diagram illustrating means for driving data and control bus lines on digital memory modules utilizing the enhanced timing margin and reduced power dissipating configuration of the present invention.

The present invention is illustrated in FIG. 2 and comprises a single line driver for the memory buss line being driven, one or more combinational logic gates for selecting or combining logic signals to be communicated over the memory buss line, and a transition time adjustment circuit for each signal that would other be wired-OR through its line driver buss interface in the present art. Strobe A is a transition time adjust circuit coupled to memory logic for input A. Strobe B is a transition time adjust circuit for input B. The outputs of these circuits are coupled as inputs t OR gate 200. The output of OR gate 200 is coupled through buffer 201.

Line Driver

The present invention implements a single line driver for each line in the memory buss thereby eliminating the noise and distortion produced at the clock transitions. Where multiple memory modules are connected in parallel to the memory buss, the invention can be applied by putting comparable signals from each memory module through an OR-gate whose output is coupled to the single line driver which drivers the appropriate line in the memory buss. The OR-gate could be located off the memory module thus affecting system architecture. The present invention would nevertheless reduce the number of wired-OR line drivers by half.

Logic Gates

The combinational logic used in the present invention typically comprises a single, 2-input OR-gate. Additional inputs can be added for custom memory configurations where more than two signals and line driver outputs would be connected in the wired-OR configuration of the present art.

Transition Time Adjustment Circuit

This circuit provides the capability to adjust circuit timing by providing independent rise and fall time adjustment capability. This can be used to set up conditions in anticipation of a transition, adjust the timing margin by allowing one signal to transition quickly while the other is slowed, and by avoiding the situation where both transitioning signals are simultaneously in regions of high noise susceptibility.

Example Embodiment of Transition Time Adjustment Circuit

Figure 3:
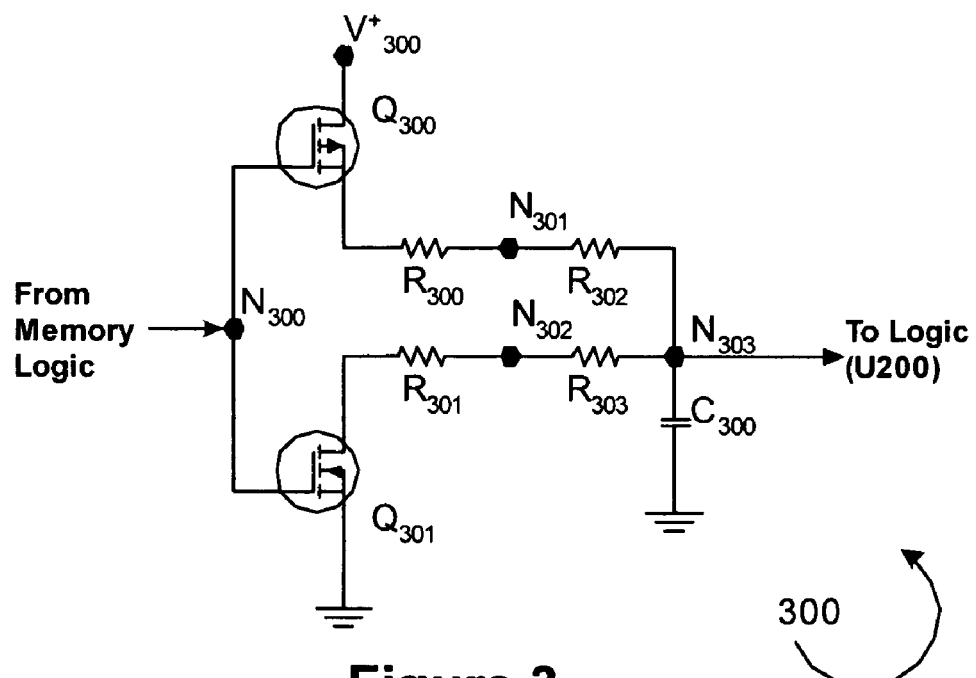
FIG. 3 is a circuit diagram of the preferred embodiment of the asymmetric rise and fall time generating circuit of the present invention.

An example embodiment is shown in FIG. 3. Resistors R300 and R301 represent the series resistance of the FET and package. Resistors R302 and R303 are selectable to set the RC time constant in conjunction with C300 that produce the desired (asymmetric rise and fall time). The input from memory logic is coupled to node N300. Node N300 is coupled to transistors Q300 (coupled to Voltage V300) and Q301 (coupled to ground). The output of transistor Q300 is coupled through resistor R300 to node N301. The output of transistor Q301 is coupled to node N302 through resistor R301. Nodes N301 and N302 are coupled to Node N303 through resistors R302 and R303 respectively. Node N303 is coupled through capacitor C300 to ground and to logic U200.

Figure 4:
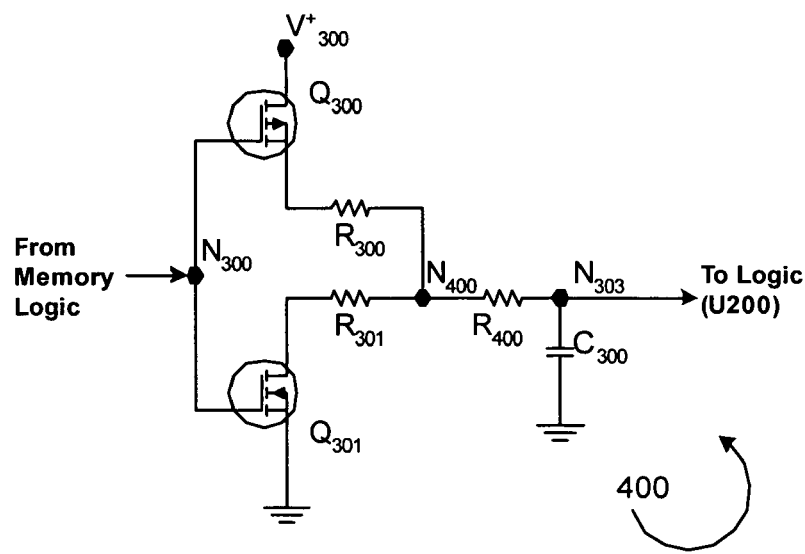
FIG. 4 is a circuit diagram of an alternate embodiment of the asymmetric rise and fall time generating circuit of the present invention.

FIG. 4 shows an alternate embodiment where the resistance values are determined in the manufacturing process by varying the size and doping characteristics of the FETs to produce the desired resistance ratio. As in FIG. 3, the input signal is coupled through node N300 through a pair of transistors Q300 and Q301 through resistors R300 and R301. In this embodiment the outputs of resistors R300 and R301 are coupled to node N400. Node N400 is coupled through resistor R400 to Node N303. Node N303 is pulled to ground via capacitor C300.

Single Transistor Embodiments

Figure 5:
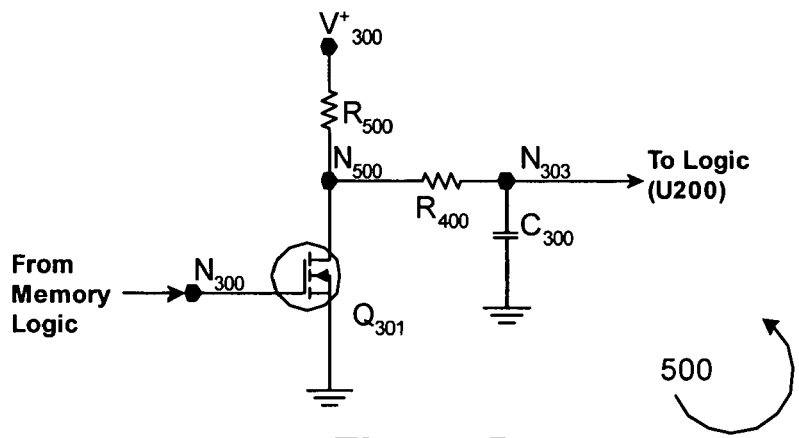
FIG. 5 is a circuit diagram of another alternate embodiment of the asymmetric rise and fall time generating circuit of the present invention.
Figure 6:
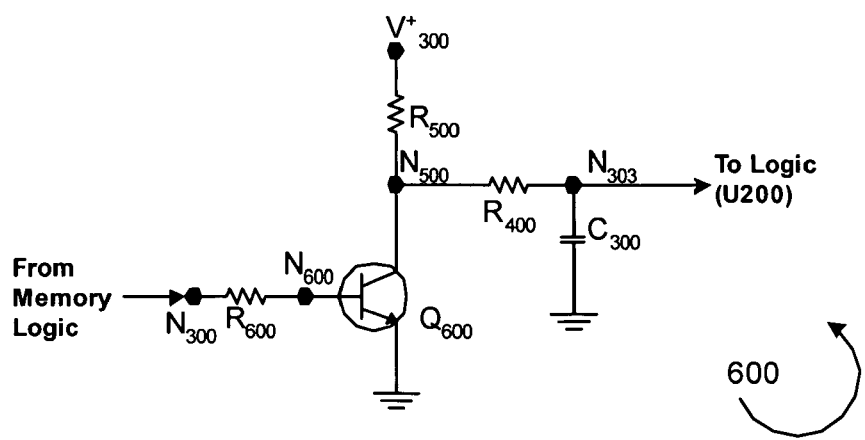
FIG. 6 is a circuit diagram of an alternate embodiment of the asymmetric rise and fall time generating circuit of the present invention.

FIGS. 5 and 6 illustrate embodiments of the transition time adjustment circuit using a single switching transistor. The circuit of FIG. 5 uses a single FET Q301 coupled to the input node N300. Instead of the transistor Q300, the supply voltage V300 is coupled through resistor R500 to Node N500. The remainder of the circuit matches that of FIG. 4.

The circuit of FIG. 6 uses a single bipolar transistor Q600 with "ON" state base current provided from node N300 through resistor R600. Resistor R500 effectively replaces the upper switching device Q300 in the totem pole structure of the prior embodiments. The remainder of the circuit matches that of FIGS. 4 and 5.

The benefits of single switching transistor embodiments is a potential savings in cost.

Thus, an Enhanced Timing Margin Memory Interface electronic circuit has been described.

We claim:

1. A memory interface comprising:
    a first memory interface logic input signal coupled through a first transition time adjust circuit and having a first time adjusted output coupled directly to a first input of an OR gate;
    a second memory interface logic input signal coupled through a second transition time adjust circuit and having a second time adjusted output coupled directly to a second input of an OR gate;
    such that only the first and second time adjusted outputs are selectable at said OR gate.

2. The interface of claim 1 further includes strobing the output of the OR gate for said first or second signal.

3. The interface of claim 1 wherein the first transition time adjust circuit comprises:
    a first and second signal path for receiving the first input signal;
    the first signal path comprising a first transistor having an output coupled through first and second resistors to an output node;
    the second signal path comprising a second transistor coupled through third and fourth resistors to the output node.

4. The interface of claim 3 further including a capacitor coupled to the output node.

5. The interface of claim 4 wherein the values of the resistors and capacitors are such that a time constant results with a desired rise and fall time.

6. The interface of claim 5 wherein the desired rise and fall time is asymmetric.

7. The interface of claim 1 wherein the first transition time adjust circuit comprises:
    a first and second signal path coupled to a first node;
    the first signal path comprising a first transistor coupled through a first resistor to the first node;
    the second signal path comprising a second transistor coupled through a second resistor to the first node;

the first node coupled through a third resistor to an output node.

8. The interface of claim 7 further including a capacitor coupled to the output node.

9. The interface of claim 8 wherein the characteristic of the first and second transistors result in a desired resistance ratio.

10. The interface of claim 1 wherein the first transition time adjust circuit comprises:
a first signal path coupled to the first input signal and through a transistor to a first node;
a first resistor coupled to the first node;
the first node coupled through a second resistor to an output node;
a capacitor coupled to the output node.

11. The interlace of claim 10 wherein the transistor is a FET.

12. The interface of claim 10 wherein the transistor is a bipolar transistor.

13. A memory interface comprising:
a first input signal coupled to a first input of an OR gate through a first transition time adjust circuit;
a second input signal coupled to a second input of an OR gate through a second transition time adjust circuit;
wherein the first transition time adjust circuit comprises:
a first and second signal path for receiving the first input signal;
the first signal path comprising a first transistor having an output coupled through first and second resistors to an output node;
the second signal path comprising a second transistor coupled through third and fourth resistors to the output node.

14. The interface of claim 13 further includes strobing the output of the OR gate for said first or second signal.

15. The interface of claim 13 further including a capacitor coupled to the output node.

16. The interface of claim 15 wherein the values of the resistors and capacitors are such that a time constant results with a desired rise and fall time.

17. The interface of claim 16 wherein the desired rise and fall time is asymmetric.

18. The interface of claim 13 wherein the first transition time adjust circuit comprises:
a first and second signal path coupled to a first node;
the first signal path comprising a first transistor coupled through a first resistor to the first node;
the second signal path comprising a second transistor coupled through a second resistor to the first node;
the first node coupled through a third resistor to an output node.

19. The interface of claim 18 further including a capacitor coupled to the output node.

20. The interface of claim 19 wherein the characteristic of the first and second transistors result in a desired resistance ratio.

21. The interface of claim 13 wherein the first transition time adjust circuit comprises:
a first signal path coupled to the first input signal and through a transistor to a first node;
a first resistor coupled to the first node;
the first node coupled through a second resistor to an output node;
a capacitor coupled to the output node.

22. The interface of claim 21 wherein the transistor is a FET.

23. The interface of claim 21 wherein the transistor is a bipolar transistor.

* * * * *